United States Patent [19]
Nishio et al.

[11] Patent Number: 5,412,262
[45] Date of Patent: May 2, 1995

[54] SEMICONDUCTOR INTEGRATED CIRCUIT DEVICE HAVING PLURALITY OF SUPPLY POTENTIAL LINES CONNECTED THERETO, AND SYSTEM EMPLOYING THE SAME

[75] Inventors: Yoji Nishio; Fumio Murabayashi; Kozaburo Kurita; Masahiro Iwamura, all of Hitachi, Japan

[73] Assignee: Hitachi, Ltd., Tokyo, Japan

[21] Appl. No.: 279,626

[22] Filed: Jul. 25, 1994

Related U.S. Application Data

[63] Continuation of Ser. No. 41,458, Apr. 2, 1993, which is a continuation of Ser. No. 571,241, Aug. 23, 1990, abandoned.

[30] Foreign Application Priority Data

Aug. 23, 1989 [JP] Japan ................. 1-215077

[51] Int. Cl.⁶ ............... H03K 19/0175; H03K 19/02
[52] U.S. Cl. ......................... 326/64; 326/68; 326/110; 327/530
[58] Field of Search ............... 307/475, 296.1, 296.4, 307/296.5, 264, 446

[56] References Cited

U.S. PATENT DOCUMENTS

| | | | |
|---|---|---|---|
| 4,131,808 | 12/1978 | Kuo | 307/475 |
| 4,437,171 | 3/1984 | Hudson et al. | 307/475 |
| 4,453,095 | 6/1984 | Wrathall | 307/475 |
| 4,486,670 | 12/1984 | Chan et al. | 307/475 |
| 4,654,549 | 3/1987 | Hannington | 307/475 |
| 4,675,544 | 6/1987 | Schrenk | 307/475 |
| 4,723,082 | 2/1988 | Asano et al. | 307/475 |
| 4,782,251 | 11/1988 | Tsugaru et al. | 307/475 |
| 4,963,771 | 10/1990 | Chang | 307/475 |
| 4,998,029 | 3/1991 | Sundstrom | 307/475 |
| 5,021,691 | 6/1991 | Saito | 307/475 |
| 5,067,003 | 11/1991 | Okamura | 307/446 |
| 5,132,573 | 7/1992 | Tsuru et al. | 307/446 |
| 5,216,298 | 6/1993 | Ohba et al. | 307/475 |
| 5,300,833 | 4/1994 | Oguri | 307/446 |
| 5,359,553 | 10/1994 | Shiomi | 307/446 |

Primary Examiner—Edward P. Westin
Assistant Examiner—Richard Roseen
Attorney, Agent, or Firm—Antonelli, Terry, Stout & Kraus

[57] ABSTRACT

In a system wherein a plurality of semiconductor integrated circuit devices are coexistent and wherein a plurality of supply potential lines are laid, the main power sources of a TTL interface LSI and an ECL interface LSI are shared so as to reduce the number of supply potential lines. Besides, in a case where an LSI, for example, BiCMOS LSI to interface with both the TTL and ECL interface LSI's has a device withstand voltage of about 3 V, it is permitted to interface with both the LSI's across the supply voltage |5 V| of the main power source of the TTL interface LSI and the supply voltage |2 V| of the power source of the emitter follower portion of the ECL interface LSI because the supply voltages have a difference of 3 V.

14 Claims, 9 Drawing Sheets

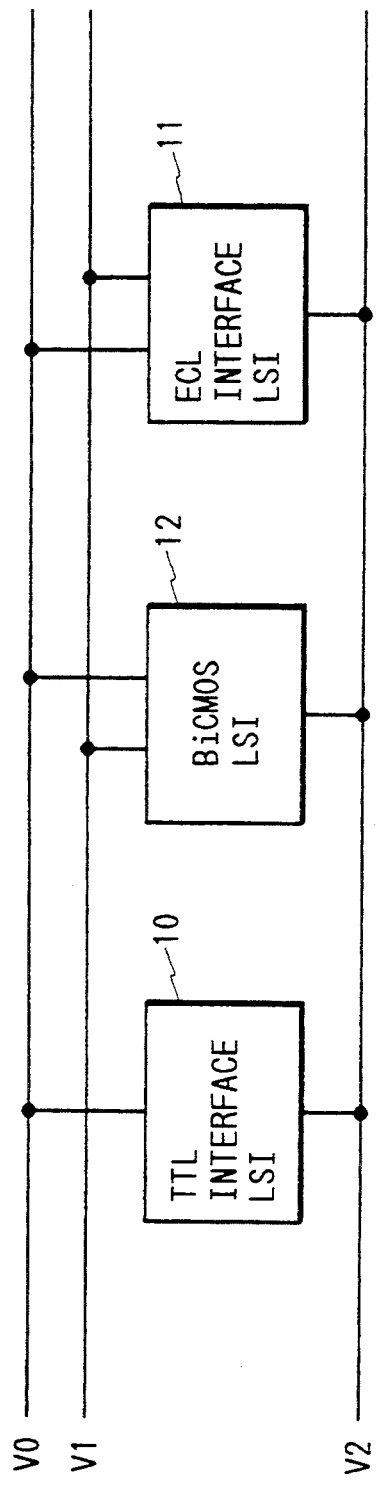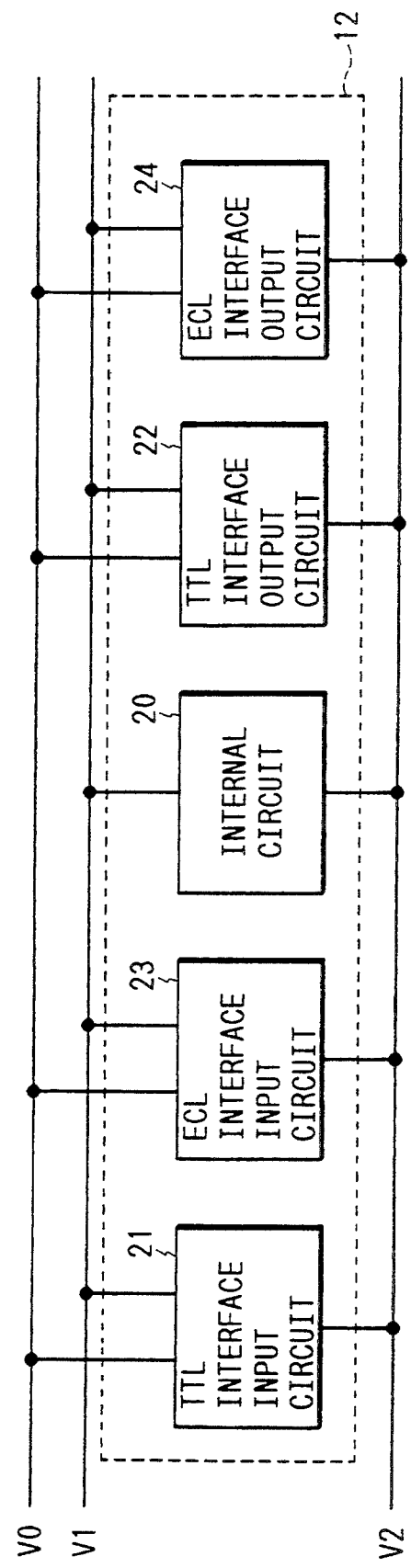

SEMICONDUCTOR INTEGRATED CIRCUIT DEVICE HAVING PLURALITY OF SUPPLY POTENTIAL LINES CONNECTED THERETO, AND SYSTEM EMPLOYING THE SAME

This application is a continuation of application Ser. No. 041,458, filed on Apr. 2, 1993, which is a continuation of application Ser. No. 571,241 filed Aug. 23, 1990, abandoned.

BACKGROUND OF THE INVENTION

The present invention relates to a semiconductor integrated circuit device (hereinbelow, simply termed "LSI") which includes a plurality of semiconductor integrated circuits adapted to operate with a low supply voltage and which has a system power source scheme permitting this LSI to interface with various interface LSI's, and a system which employs the LSI specified above.

A system power source scheme for permitting a certain LSI to simultaneously interface with both a TTL (transistor-transistor logic) interface LSI and an ECL (emitter-coupled logic) interface LSI, has heretofore been as described in "Hitachi Review", Vol. 70, No. 12, p. 80 (1988). It is schematically shown in FIG. 12. Numeral 120 designates the LSI which is simultaneously interfaceable with both the TTL and ECL interface LSI's. The TTL interface LSI 10 is fed with a 5-V supply voltage and a ground potential, while the ECL interface LSI 11 is fed with the ground potential and a $-5.2$-V supply voltage and also with a $-2$-V supply voltage for an emitter follower portion. The LSI 120 is fed with the 5-V supply voltage and the ground potential for interfacing with the TTL interface LSI 10. In addition, it is fed with the ground potential and the $-2$-V supply voltage and also with a $-4$-V supply voltage or the $-5.2$-V supply voltage in order to interface with the ECL interface LSI 11. In FIG. 12, it is fed with the $-4$-V supply voltage. The reason why the voltage $-4$ V is supplied here, is as stated below. If the withstand voltage of the internal circuit of the LSI 120 is 5 V or more, this LSI may be connected to the power source of $-5.2$ V. However, when the withstand voltage is about 4 V, the LSI 120 is connected to the power source of $-4$ V so as to connect the internal circuit thereof across the ground potential and the $-4$-V supply voltage and to operate them.

The prior-art technique mentioned above has the problem that, since the number of the power sources (exactly, supply potential lines) including the ground power source is as large as five, the wiring of the power sources is complicated to render the system costly. Moreover, since a potential difference of 9 V at the maximum is applied to the LSI 120, a problem in reliability might be posed when the withstand voltages of devices lower with the progress of microfabrication processes.

It is accordingly an object of the present invention to reduce the number of supply potential lines in an LSI system (or a system employing a semiconductor integrated circuit device) including an LSI which is simultaneously interfaceable with both a TTL interface LSI and an ECL interface LSI.

Another object of the present invention is to provide an LSI having a system power source scheme in which a certain LSI is simultaneously interfaceable with both a TTL interface LSI and an ECL interface LSI by means of a small number of supply potential lines.

Still another object of the present invention is to provide, in an LSI system including an LSI which is simultaneously interfaceable with both a TTL interface LSI and an ECL interface LSI, an LSI system having a system power source scheme which can secure the device withstand voltage of the LSI.

Yet another object of the present invention is to provide an LSI system in which a BiCMOS LSI (a hybrid LSI including bipolar transistors and complementary metal-oxide-semiconductor field effect transistors) composed of a device having a device withstand voltage less than 5 V is simultaneously interfaceable with both a TTL interface LSI and an ECL interface LSI.

A further object of the present invention is to provide a data processor in which a BiCMOS processor LSI composed of a device having a device withstand voltage less than 5 V is simultaneously interfaceable with a TTL interface LSI and an ECL interface LSI that are coexistent.

Other objects of the present invention will become apparent from the ensuing description.

SUMMARY OF THE INVENTION

In order to accomplish the objects, the number of supply potential lines is reduced using the main power sources of a TTL interface LSI and an ECL interface LSI in common. Besides, in a case where a pertinent LSI which interfaces with both the LSI's has a device withstand voltage of about 3 V, it is inserted between the voltage $|5\,V|$ of the main power source of the TTL interface LSI and the voltage $|2\,V|$ of the power source of the emitter follower portion of the ECL interface LSI because the difference of the supply voltages is 3 V. Thus, the difference voltage is utilized as the main power source of the pertinent LSI, thereby to prevent the number of supply potential lines from increasing. Further, in this way, only the voltage of 3 V is applied to the pertinent LSI, thereby to secure the device withstand voltage of this LSI.

On the other hand, in a case where a pertinent LSI which interfaces with both the TTL and ECL interface LSI's has a device withstand voltage of about 4 V, a supply potential line which affords a potential difference of 4 V relative to one of the shared main power sources of the TTL and ECL interface LSI's is added, whereby increase in the number of supply potential lines is suppressed to the minimum. Further, in this way, only the voltage of 4 V is applied to the pertinent LSI interfacing with both the LSI's, thereby to secure the device withstand voltage of the pertinent LSI.

Moreover, the supply potential line of the coexistent TTL interface LSI on a lower potential side and that of the coexistent ECL interface LSI on a higher potential side are connected to the input/output interface circuits of a pertinent LSI interfacing with both the LSI's, whereby the pertinent LSI is permitted to interface with both the TTL interface LSI and the ECL interface LSI.

As described above, the main power sources of the TTL interface LSI and the ECL interface LSI are used in common. Therefore, whereas the prior art requires the three sorts of power sources of $+5$ V, the ground potential and $-5.2$ V as the main power sources, the invention can reduce the number of power sources to the two sorts of power sources of the ground potential and $-5.2$ V. In addition, since the aforementioned −5.2-V power source and the −2-V power source of the emitter follower portion of the ECL circuit afford a potential difference of 3.2 V, they are utilized as the main power sources of the pertinent LSI which has a low device withstand voltage and which interfaces with both the ECL and TTL interface LSI's. Thus, the device withstand voltage can be secured without increasing the number of power sources.

On the other hand, in the case where the pertinent LSI which interfaces with both the ECL and TTL interface LSI's has the device withstand voltage of about 4 V, only one power source of, for example, −4 V which is 4 V lower than the ground power source being one of the main power sources is added, and the −4-V power source and the ground potential are used as the main power sources of the pertinent LSI. Thus, the number of power sources to be increased can be minimized, and the device withstand voltage can be secured.

Moreover, an ECL interface level is determined with reference to the higher potential side of the ECL interface LSI, whereas a TTL interface level is determined with reference to the lower potential side of the TTL interface LSI. Accordingly, the pertinent LSI can interface with both the TTL and ECL interface LSI's in the way that the supply potential line of the coexistent ECL interface LSI on the higher potential side and the supply potential line of the coexistent TTL interface LSI on the lower potential side are connected to the input/output interface circuits of the pertinent LSI beforehand.

BRIEF DESCRIPTION OF THE DRAWINGS

FIG. 1 is a diagram of an LSI system power source scheme showing an embodiment of the present invention;

FIG. 2 is a diagram of the internal arrangement and power source scheme of a BiCMOS LSI in FIG. 1;

DETAILED DESCRIPTION OF THE PREFERRED EMBODIMENTS

Figure 3:
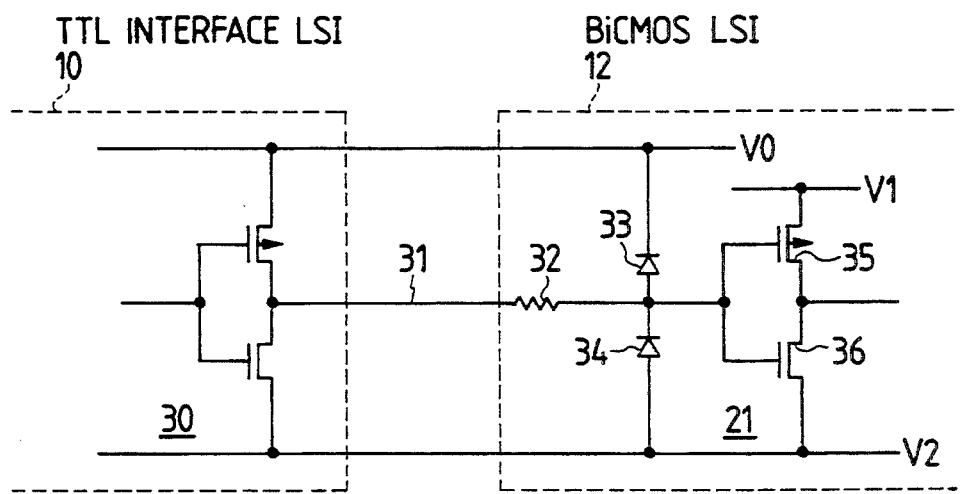
FIG. 3 is a diagram of a circuit arrangement in the case where the BiCMOS LSI interfaces with a TTL interface LSI in FIG. 1.

Now, an embodiment of the present invention will be described in detail with reference to the drawings. FIG. 1 shows a system power source scheme. The embodiment includes a general-purpose TTL interface LSI 10, a general-purpose ECL interface LSI 11, and a BiCMOS LSI 12. A supply potential line of supply voltage V0 and a supply potential line of supply voltage V2 are connected to the TTL interface LSI 10. The supply potential lines having the supply voltages V0 and V2 shall be called the "power source V0" and the "power source V2", respectively. The ECL interface LSI 11 is fed with a supply voltage V1 in addition to the supply voltages V0 and V2. By way of example, the potentials of the supply voltages V0, V2 and V1 are the ground potential, −5.2 V (−5 V or −4.5 V) and −2 V, respectively. Here, the power sources V0 and V2 are shared as the main power sources of the TTL interface LSI 10 and the ECL interface LSI 11, while the power source V1 (the supply potential line of the supply voltage V1) is used for the emitter follower portion of the ECL circuit. The BiCMOS LSI 12 manufactured by microfabrication technology is to be operated with a supply potential difference less than 5 V from the viewpoints of a device withstand voltage etc. Here, let's consider a case where the source—drain withstand voltage of a MOS FET is about 3 V. Since the supply voltages V1 and V2 have a potential difference of 3.2 V or 3 V, they are fed as the main power sources of the BiCMOS LSI 12. Herein, the BiCMOS LSI 12 is also connected to the power source V0 so as to be interfaceable with both the TTL interface LSI 10 and the ECL interface LSI 11.

Next, the internal power source scheme of the BiCMOS LSI 12 will be described with reference to FIG. 2. The BiCMOS LSI 12 includes an internal circuit 20, a TTL interface input circuit 21, a TTL interface output circuit 22, an ECL interface input circuit 23 and an ECL interface output circuit 24. In a case where the internal circuit 20 is a CMOS-type circuit, it is fed with the supply voltages V1 and V2 as illustrated in the figure. If the internal circuit 20 is an ECL-type circuit, it is further fed with the supply voltage V0, and the supply voltage V1 is used as the power source of the emitter follower portion. Each of the interface input/output circuits 21, 22, 23 and 24 is fed with the supply voltages V0, V1 and V2.

Next, there will be described practicable examples of the input/output circuits which are interfaceable with the respective interface LSI's without any problem.

FIG. 3 shows a case where the BiCMOS LSI 12 interfaces with the TTL interface LSI 10 and receives the output thereof. The output 31 from the output circuit 30 of the TTL interface LSI 10 is input to the TTL interface input circuit 21 of the BiCMOS LSI 12 configured of a PMOS (P-channel MOS FET) 35 and an NMOS (N-channel MOS FET) 36, through a resistor 32 and diodes 33, 34 which are input protective elements. The output circuit 30 of the TTL interface LSI 10 is fed with the supply voltages V0 and V2, the input circuit 21 of the BiCMOS LSI 12 is fed with the supply voltages V1 and V2, and a series circuit consisting of the protective diodes 33 and 34 is fed with the supply voltages V0 and V2. Here, if the cathode of the diode 33 is connected to the power source V1 equal in potential to the source of the PMOS 35 as in a conventional input circuit portion, the diode 33 is forward-biased for the output potential V0 of the output circuit 30 and might be destroyed due to the flow of an excess current. Therefore, the cathode of the diode 33 is connected to the highest potential V0.

In a case where, contrariwise to the above, the output of the BiCMOS LSI 12 is input to the input circuit of the TTL interface LSI 10, no particular problem is posed, and hence, the description of the case shall be omitted.

Figure 4:
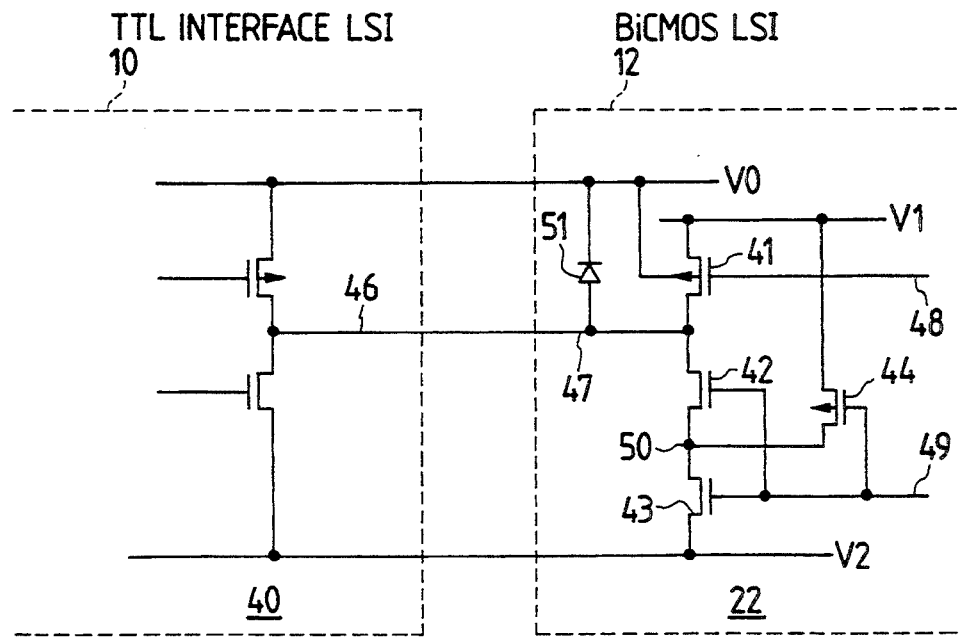
FIG. 4 is a diagram of another circuit arrangement in the case where the BiCMOS LSI interfaces with the TTL interface LSI in FIG. 1.

FIG. 4 shows a case where the BiCMOS LSI 12 interfaces with the TTL interface LSI 10 and where the outputs of the 3-state output circuits of both the LSI's are connected. The output 46 of the 3-state output circuit 40 of the TTL interface LSI 10 is connected with the output 47 of the TTL interface 3-state output circuit 22 configured of PMOS's 41, 44 and NMOS's 42, 43 in the BiCMOS LSI 12. The 3-state output circuit 40 of the TTL interface LSI 10 is fed with the supply voltages V0 and V2, the 3-state output circuit of the BiCMOS LSI 12 is fed with the supply voltages V1 and V2, and the potential of the N well (N-type well region) of the PMOS 41 is set at the supply voltage V0. The operation of this example will now be described. Since the 3-state circuit 40 in the TTL interface LSI 10 is a conventional circuit, it shall be omitted from the description.

TABLE 1

| Potential of Input 48 | Potential of Input 49 | PMOS 41 | NMOS's 42, 43 | PMOS 44 | Potential of Node 50 | Potential of Output 47 |
| --- | --- | --- | --- | --- | --- | --- |
| V1 (H level) | V2 (L level) | Off | Off | On | V1 | Hi-Z |
| V2 (L level) | V2 (L level) | On | Off | On | V1 | V1 (H level) |
| V1 (H level) | V1 (H level) | Off | On | Off | V2 | V2 (L level) |

The operations of the 3-state output circuit 22 in the BiCMOS LSI 12 are listed in Table 1. When the potential of an input 48 is the voltage V1 (a high level abbreviated to "H level") and the potential of an input 49 is the voltage V2 (a low level abbreviated to "L level"), the PMOS 41 turns "off" and also the NMOS's 42, 43 turn "off", so that the output 47 becomes a Hi-Z (high impedance) state. On this occasion, when the 3-state output circuit 40 of the TTL interface LSI 10 delivers an H level, namely, when the potential of the output 46 becomes the value V0, the potential difference of |V0-V2| is applied across the NMOS's 42 and 43. Since this potential difference is about 5 V and exceeds the device withstand voltage of one MOS FET, the two MOS FET's of the NMOS's 42 and 43 are inserted so as to secure the device withstand voltage. That is, on that occasion, the potential of a node 50 is fixed to the value V1 through the PMOS 44, and the potential to be applied across one NMOS is distributed, thereby to secure the device withstand voltage.

In addition, when the potential of the output 46 becomes the value V0 under the Hi-Z state of the output 47 of the 3-state circuit 22, the potential difference, 2 V of |V0-V1| is applied across the PMOS 41. Accordingly, if the N well of the PMOS 41 is connected to the source thereof as in the conventional manner, a diode 51 parasitic to the PMOS 41 is forward-biased by the potential of the N well, and an excess current might flow to destroy the element. Therefore, the N well of the PMOS 41 is held at the potential V0.

When the potential of the input 48 is the value V2 (the L level) and also the potential of the input 49 is the value V2 (the L level), the PMOS 41 turns "on", and the NMOS's 42, 43 turn "off", so that the level of the output 47 becomes the value V1 (the H level). To the contrary, when the potentials of the inputs 48 and 49 have the value V1 (the H level), the PMOS 41 turns "off", and the NMOS's 42, 43 turn "on", so that the level of the output 47 becomes the value V2 (the L level).

Figure 5:
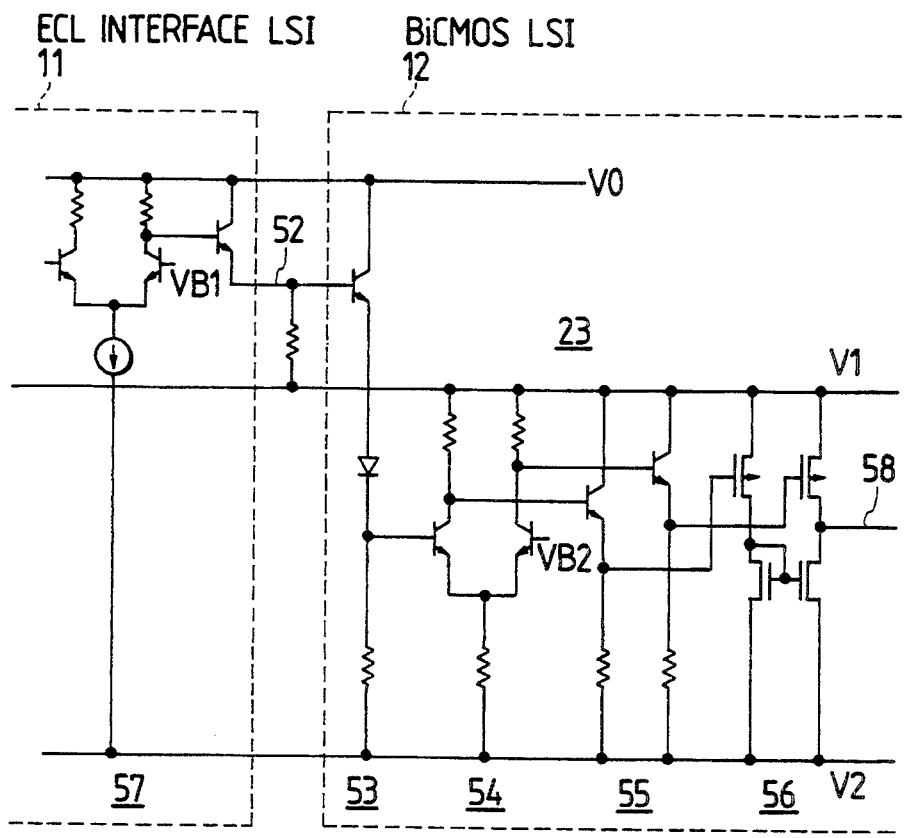
FIG. 5 is a diagram of a circuit arrangement in the case where the BiCMOS LSI interfaces with an ECL interface LSI in FIG. 1.

FIG. 5 shows a case where the BiCMOS LSI 12 interfaces with the ECL interface LSI 11 and receives the output thereof. The output 52 of the output circuit 57 of the ECL interface LSI 11 is input to that ECL interface input circuit 23 of the BiCMOS LSI 12 which is configured of a level shift circuit 53, a differential circuit 54, a level shift circuit 55 and a CMOS level amplifier circuit 56. The output circuit of the ECL interface LSI 11 is fed with the supply voltages V0 and V2, and the emitter follower portion thereof is fed with the supply voltage V1. The input circuit 23 of the BiCMOS LSI 12 is fed with the supply voltages V1 and V2, and the first-stage level shift circuit 53 thereof is also fed with the supply voltage V0.

Next, the operation of this example will be described. Since the power sources V0 and V1 afford a potential difference of 2 V, the level of the output 52 of the ECL output circuit 57 is lowered 2 $V_{BE}$ by the level shift circuit 53. Thereafter, the lowered level is passed through an ECL→MOS level converter circuit which is configured of the differential circuit 54, level shift circuit 55 and level amplifier circuit 56. Thus, a MOS level output 58 having the level amplitude of |V1-V2| is produced.

Figure 6:
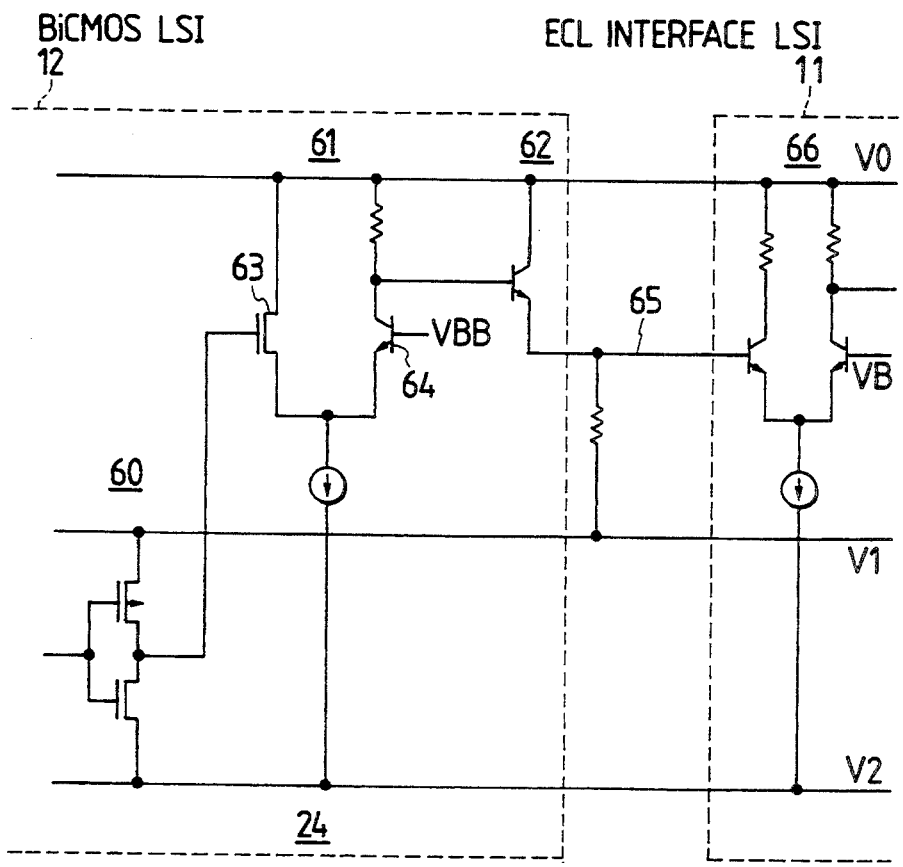
FIG. 6 is a diagram of another circuit arrangement in the case where the BiCMOS LSI interfaces with the ECL interface LSI in FIG. 1.

FIG. 6 shows a case where the BiCMOS LSI 12 interfaces with the ECL interface LSI 11 and delivers an output thereto. An ECL interface output circuit 24 is constructed of a CMOS inverter 60, a MOS→ECL level converter circuit 61 which is configured of an NMOS 63 and a bipolar transistor 64, and an emitter follower 62. The output 65 of the output circuit 24 is input to the first stage of an ECL input circuit which is constructed of a differential circuit 66 configured of bipolar transistors. The input circuit of the ECL interface LSI 11 is fed with the supply voltages V0 and V2, and the emitter follower portion thereof is fed with the supply voltage V1. The output circuit 24 of the BiCMOS LSI 12 is fed with the supply voltages V1 and V2, and it is also fed with the supply voltage V0 in order to adjust the output 65 to an ECL level.

Next, the operation of this example will be described. When the output level of the CMOS inverter 60 is the value V1, the NMOS 63 of the differential circuit 61 turns "on", and the bipolar transistor 64 thereof turns "off", so that the output 65 becomes its H level. To the contrary, when the output level of the CMOS inverter 60 is the value V2, the NMOS 63 of the differential circuit 61 turns "off", and the bipolar transistor 64 thereof turns "on", so that the output 65 becomes its L level.

According to this embodiment, the main power sources of the TTL interface LSI and the ECL interface LSI are shared, and the BiCMOS LSI is inserted between the power source for the emitter follower of the ECL interface LSI and one of the main power sources, thereby to utilize the power source for the emitter follower as the main power source of the BiCMOS LSI, so that the number of power sources (including the ground potential) can be reduced to 3, and only the voltage of about 3 V is applied to the CMOS-type internal circuit of the BiCMOS LSI, so that the device withstand voltage can be secured. Furthermore, since the BiCMOS LSI can interface with both the TTL interface LSI and the ECL interface LSI, a versatile LSI can be constructed.

Figure 7:
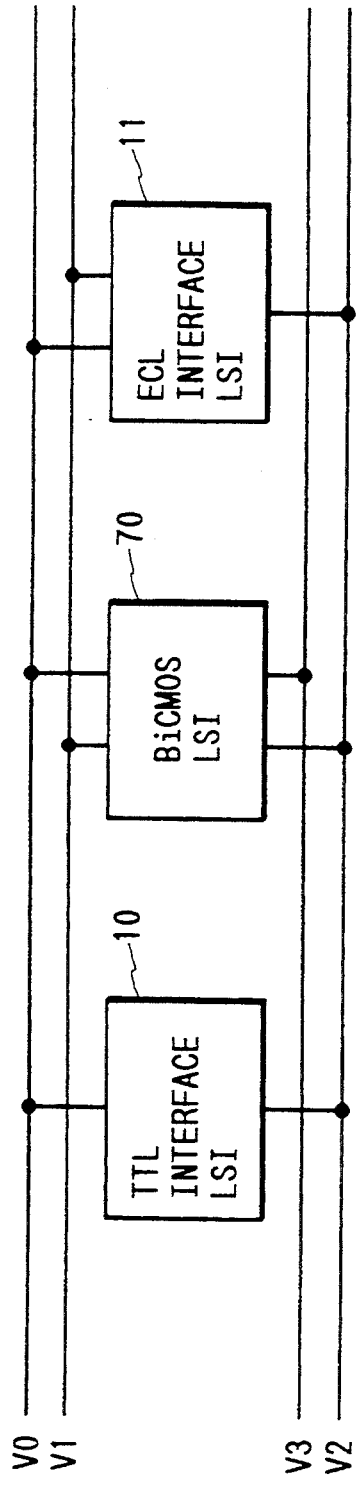
FIG. 7 is a diagram of an LSI system power source scheme showing another embodiment of the present invention.

Now, another embodiment of the present invention will be described. FIG. 7 shows a system power source scheme. Although the embodiment in FIG. 1 has referred to the case where the device withstand voltage of the BiCMOS LSI 12 is about 3 V, here will be considered a case where it is about 4 V. The embodiment in FIG. 7 includes a general-purpose TTL interface LSI 10, a general-purpose ECL interface LSI 11 and a BiCMOS LSI 70. Likewise to the case of FIG. 1, the TTL interface LSI 10 is fed with supply voltages V0 and V2, and the ECL interface LSI 11 is fed with a supply voltage V1 in addition to the supply voltages V0 and V2. By way of example, the potentials of the power sources V0, V2 and V1 are the ground potential, −5.2 V (−5 V or −4.5 V) and −2 V, respectively. Here, it is also the same as in the case of FIG. 1 that the power sources V0 and V2 are shared as the main power sources of the TTL interface LSI 10 and ECL interface LSI 11, and that the power source V1 is used for the emitter follower portion of the ECL circuit.

The BiCMOS LSI 70 is fed with the supply voltage V0 for interfacing with the ECL interface LSI 11, the supply voltage V2 for interfacing with the TTL interface LSI 10, the supply voltage V1 for the emitter follower of the ECL circuit, and a further supply voltage V3 for the internal circuit of this LSI 70. The potential of the power source V3 is, for example, −4 V.

Figure 8:
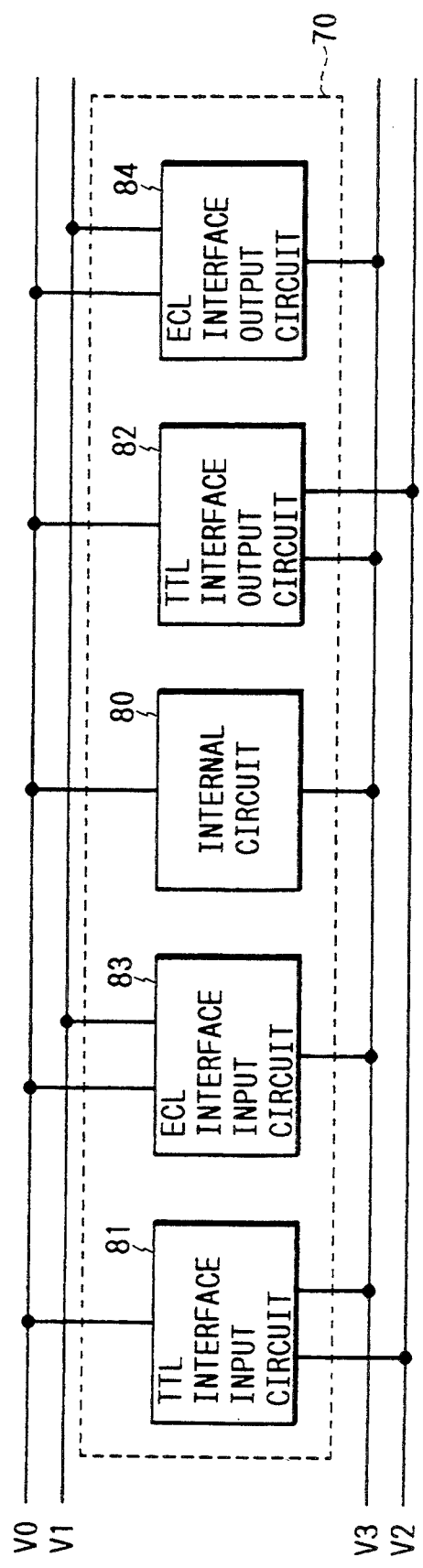
FIG. 8 is a diagram of the internal arrangement and power source scheme of a BiCMOS LSI in FIG. 7.

Next, the internal power source scheme of the BiCMOS LSI 70 will be described with reference to FIG. 8. The BiCMOS LSI 70 includes the internal circuit 80, a TTL interface input circuit 81, a TTL interface output circuit 82, an ECL interface input circuit 83 and an ECL interface output circuit 84. In a case where the internal circuit 80 is a CMOS-type circuit, it is fed with the supply voltages V0 and V3 and is operated with a potential difference of 4 V as illustrated in the figure. If the internal circuit 80 is an ECL-type circuit, it is further fed with the supply voltage V1, and the supply voltage V1 is used as the power source of the emitter follower portion of the ECL-type internal circuit. Each of the ECL interface input/output circuits 83 and 84 is fed with the supply voltages V0, V1 and V3. On the other hand, each of the TTL interface input/output circuits 81 and 82 is fed with the supply voltages V0, V2 and V3.

Next, there will be described practicable examples of the input/output circuits which are interfaceable with the respective interface LSI's without any problem.

First, the interfacing with the ECL interface LSI can be realized by ordinary circuit techniques and shall be omitted from the description.

Secondly, let's consider the interfacing with the TTL interface LSI. There are considered two cases; a case where the P substrate (P-type substrate) of the BiCMOS LSI 70 is connected to the power source V3, and a case where it is connected to the power source V2. In the case of connecting the P substrate to the power source V2 of the lowest potential (−5 V), since the internal circuit 80 is operated by the power sources V0 (GND) and V3 (−4 V), the path between the source of an NMOS and the P substrate is reverse-biased to give rise to the substrate bias effect, so that the threshold voltage of the NMOS enlarges. In this case, the operating speed of the CMOS-type internal circuit 80 degrades to some extent, but the degradation poses no problem as long as it falls within the allowable range of the system to which the embodiment is applied.

On the other hand, in the case of connecting the P substrate to the power source V3 (−4 V), the source of the NMOS, for example, cannot be connected to the power source V2 of the lowest potential (−5 V) for the purpose of the interfacing with the TTL interface LSI. If the source of the NMOS is connected to the power source V2, a forward bias of 1 V is applied across the P substrate and the source of the NMOS, and an excess current flows. Therefore, when the P substrate is connected to the power source V3 (−4 V), a measure needs to be taken as illustrated in FIG. 9 or FIG. 10 by way of example.

Figure 9:
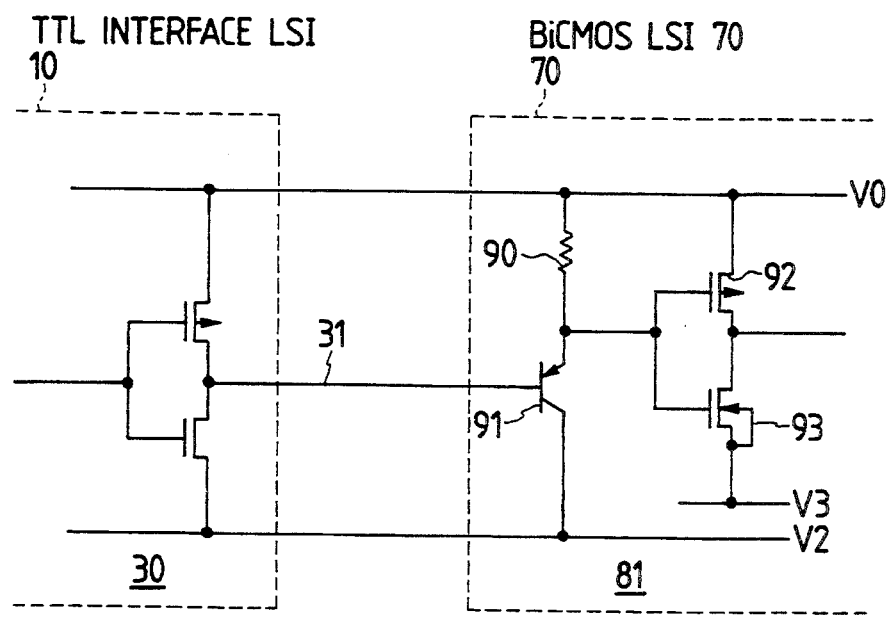
FIG. 9 is a diagram of a circuit arrangement in the case where the BiCMOS LSI interfaces with a TTL interface LSI in FIG. 7.

FIG. 9 shows a case where the BiCMOS LSI 70 interfaces with the TTL interface LSI 10 and receives the output thereof. The output 31 of the output circuit 30 of the TTL interface LSI 10 is input to that TTL interface input circuit 81 of the BiCMOS LSI 70 which is constructed of a level shift circuit configured of a resistor 90 and a PNP transistor 91, and a CMOS inverter configured of a PMOS 92 and an NMOS 93. The output circuit 30 of the TTL interface LSI 10 is fed with the supply voltages V0 and V2, while the input circuit 81 of the BiCMOS LSI 70 is fed with the supply voltages V0, V2 and V3. This example operates as follows: The power source V2 (−5 V) is connected to the source of the NMOS of the output circuit 30, and the power source V3 (−4 V) is connected to the source of the NMOS 93 of the input circuit 81, so that a potential difference of 1 V is involved between the sources of the NMOS's. Therefore, after the level of the output 31 is shifted upwards about 0.8 V by the level shift circuit configured of the resistor 90 and the PNP transistor 91, the resulting level is input to the inverter configured of the PMOS 92 and the NMOS 93.

Figure 10:
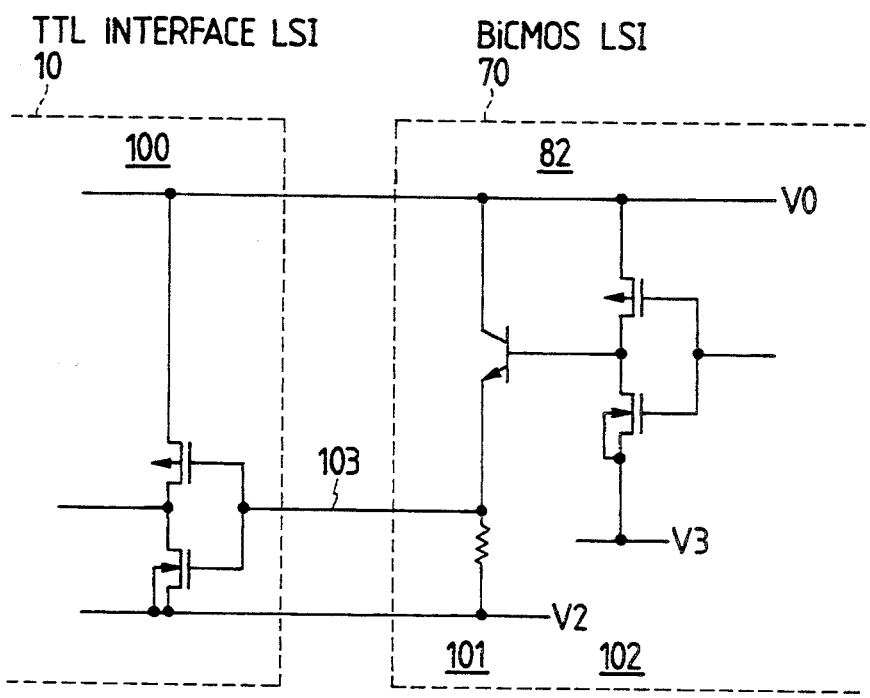
FIG. 10 is a diagram of another circuit arrangement in the case where the BiCMOS LSI interfaces with the TTL interface LSI in FIG. 7.

FIG. 10 shows a case where the BiCMOS LSI 70 interfaces with the TTL interface LSI 10 and delivers its output thereto. The TTL interface output circuit 82 of the BiCMOS LSI 70 is constructed of a CMOS inverter 102 and a level shift circuit 101, and the output 103 of this output circuit 82 is input to the input circuit

100 of the TTL interface LSI 10. The input circuit 100 of the TTL interface LSI 10 is fed with the supply voltages V0 and V2. The output circuit 82 of the BiCMOS LSI 70 is fed with the supply voltages V0 and V3, and it is also fed with the supply voltage V2 in order to adjust its output to a TTL level. This example operates as follows: The power source V2 (−5 V) is connected to the source of the NMOS of the input circuit 100 of the TTL interface LSI 10, and the power source V3 (−4 V) is connected to the source of the NMOS of the output circuit 82 of the BiCMOS LSI 70, so that a potential difference of 1 V is involved between the sources of the NMOS's. Therefore, after the output level of the CMOS inverter 102 is shifted downwards about 0.8 V by the level shift circuit 101, the resulting level is output to the input circuit 100.

According to this embodiment, the main power sources of the TTL interface LSI and the ECL interface LSI are shared, the power source V3 the supply voltage of which is 4 V lower than that of one V0 of the above main power sources is provided, and the power sources V0 and V3 are used as the main power sources of the BiCMOS LSI. Therefore, the number of power sources (including the ground potential) can be reduced to four, and besides, the voltage 4 V capable of securing the withstand voltage can be applied to the CMOS-type internal circuit of the BiCMOS LSI. Furthermore, since the BiCMOS LSI is interfaceable with the TTL interface LSI and the ECL interface LSI without inducing the substrate bias effect, a versatile LSI of high operating speed can be constructed.

In each of the preceding examples, the supply voltage V3 (−4 V) is applied to the P substrate, and the NMOS of the internal circuit is prevented from undergoing the substrate bias effect. However, the supply voltage V2 (−5 V) for the interfacing with the TTL interface LSI cannot be applied to the source of the NMOS because of the forward bias of a PN junction. Therefore, the level shift circuit is inserted as illustrated in FIG. 9 or FIG. 10.

Figure 11:
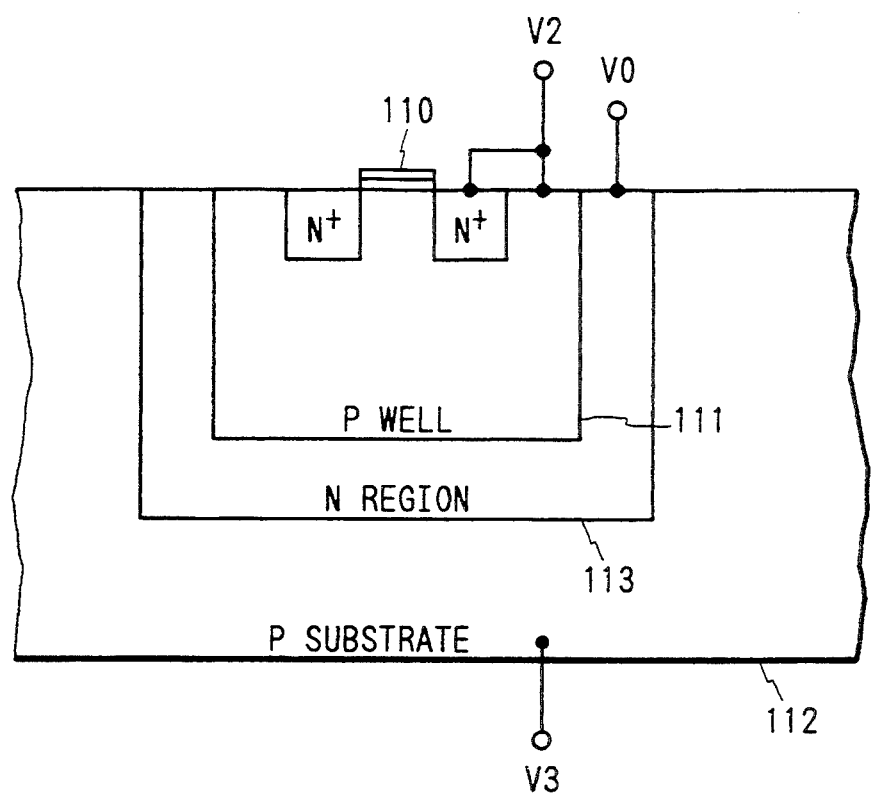
FIG. 11 is a diagram of an example of the sectional structure of the BiCMOS LSI in FIG. 7 and the potential scheme thereof.
Figure 12:
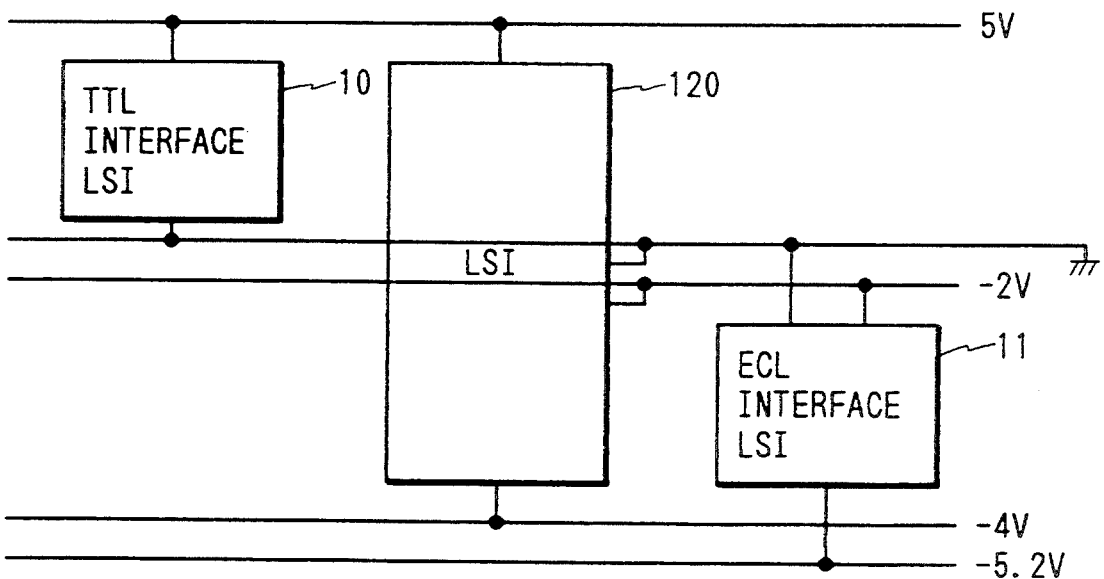
FIG. 12 is a diagram of an LSI system power source scheme in the prior art.

FIG. 11 shows an embodiment which is identical to the foregoing embodiment in that the supply voltage V3 (−4 V) is applied to the P substrate and that the NMOS of the internal circuit is prevented from undergoing the substrate bias effect, but in which a device structure is so contrived that the supply voltage V2 (−5 V) can be applied to the source of the NMOS of the output circuit and that the interfacing with the TTL interface LSI can be realized without the level shift circuit. More specifically, a P well 111 corresponding to the substrate of the NMOS 110 of the output circuit is surrounded with an N region 113 which isolates the P well 111 from the P substrate 112. Owing to this structure, the P well 111 and source of the NMOS 110 of the output circuit can be connected to the power source V2 (−5 V), so that the TTL interface input/output circuits can be constructed by ordinary circuit techniques.

According to this embodiment, the main power sources of the TTL interface LSI and the ECL interface LSI are shared, the power source V3 the supply voltage of which is 4 V lower than that of one V0 of the above main power sources is provided, and the power sources V0 and V3 are used as the main power sources of the BiCMOS LSI. Therefore, the number of power sources (including the ground potential) can be reduced to four, and besides, the voltage 4 V capable of securing the withstand voltage can be applied to the CMOS-type internal circuit of the BiCMOS LSI. Furthermore, the BiCMOS LSI is interfaceable with the TTL interface LSI and the ECL interface LSI without inducing the substrate bias effect and without providing the level shift circuits in the TTL interface input/output circuits, so that a versatile LSI of high operating speed can be constructed.

Figure 13:
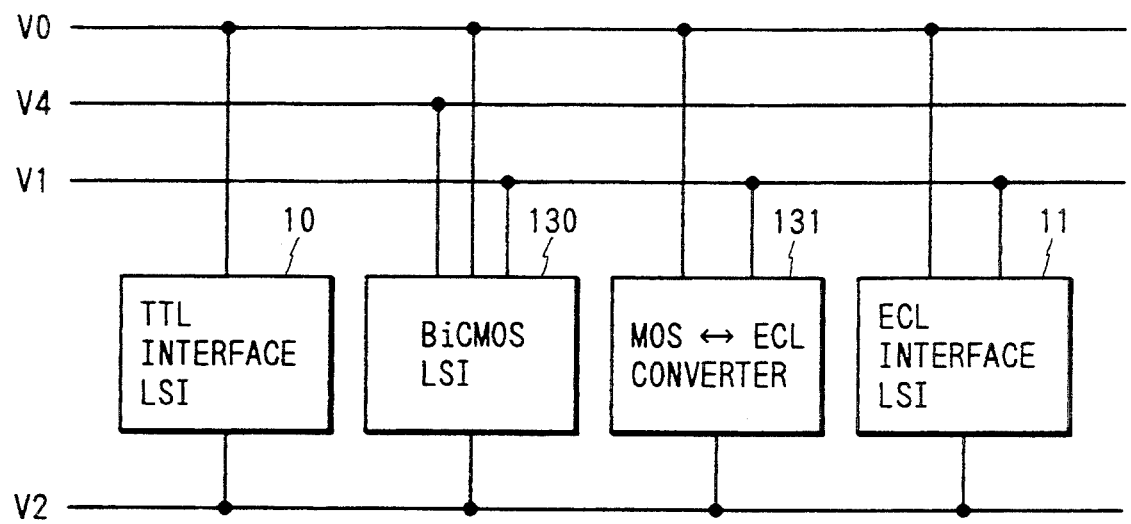
FIG. 13 is a diagram of an LSI system power source scheme showing another embodiment of the present invention.

Now, another embodiment of the present invention will be described. FIG. 13 shows a system power source scheme. While the embodiment in FIG. 7 has referred to the case where the device withstand voltage of the BiCMOS LSI 70 is about 4 V, the case of the withstand voltage of about 4 V will also be considered in the embodiment in FIG. 13. This embodiment includes a general-purpose TTL interface LSI 10, a general-purpose ECL interface LSI 11, and a BiCMOS LSI 130 and a MOS⇌ECL converter circuit 131 which are especially relevant to this embodiment. Likewise to the case of FIG. 7, the TTL interface LSI 10 is fed with supply voltages V0 and V2, and the ECL interface LSI 11 is fed with a supply voltage V1 in addition to the supply voltages V0 and V2. By way of example, the potentials of the power sources V0, V2 and V1 are the ground potential, −5.2 V (−5 V or −4.5 V) and −2 V, respectively. Here, it is also the same as in the case of FIG. 7 that the power sources V0 and V2 are shared as the main power sources of the TTL interface LSI 10 and ECL interface LSI 11, and that the power source V1 is used for the emitter follower portion of the ECL circuit.

The BiCMOS LSI 130 is fed with the supply voltages V2 and V0 for interfacing with the TTL interface LSI 10, and a supply voltage V4 for the CMOS-type internal circuit of this LSI 130. The potential of the power source V4 is, for example, −1 V, and the potential difference between the power source V4 (−1 V) and the power source V2 (−5 V) is 4 V, with which the CMOS-type internal circuit is operated. If an ECL circuit exists as the internal circuit of the BiCMOS LSI 1 30, the supply voltages V0 and V1 are also fed. The MOS⇌ECL converter circuit 131 is a circuit for adjusting the signal of the CMOS-type internal circuit of the BiCMOS LSI 130 to an ECL level. By way of example, this circuit 131 is equivalent to the ECL interface input circuit 23 shown in FIG. 5 or the ECL interface output circuit 24 shown in FIG. 6. It is also possible to include the MOS⇌ECL converter circuit 131 in the BiCMOS LSI 130.

Figure 14:
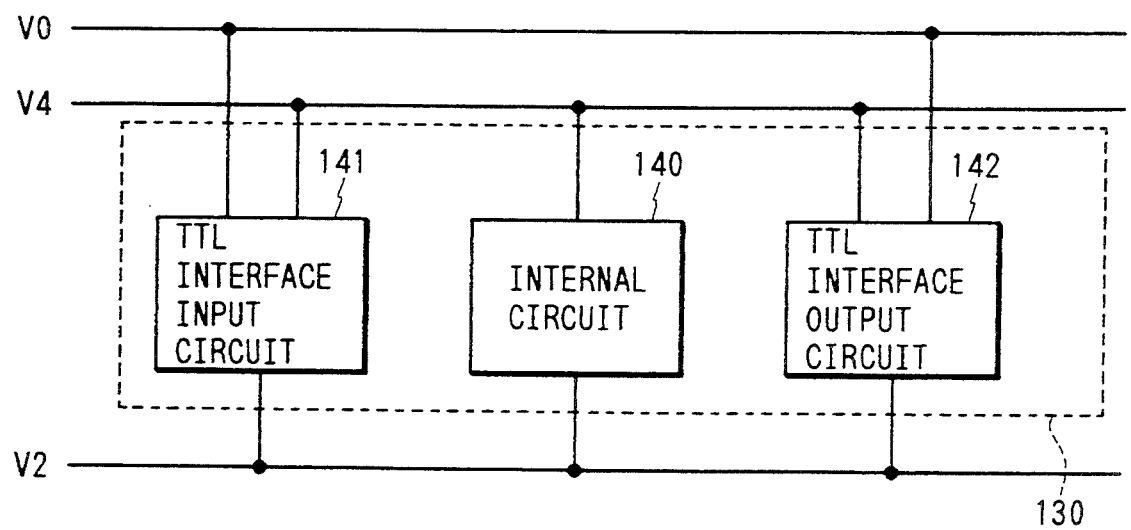
FIG. 14 is a diagram of the internal arrangement and power source scheme of a BiCMOS LSI in FIG. 13.

Next, the internal power source scheme of the BiCMOS LSI 130 will be described with reference to FIG. 14. The BiCMOS LSI 130 includes the internal circuit 140, a TTL interface input circuit 141 and a TTL interface output circuit 142. In the case where the internal circuit 140 is the CMOS-type circuit, it is fed with the supply voltages V4 and V2 and is operated with the potential difference of 4 V as illustrated in the figure. The TTL interface input/output circuits 141, 142 are fed with the supply voltages V4 and V2 and with the supply voltage V0 as may be needed.

When the BiCMOS LSI 130 interfaces with the ECL interface LSI 11, signals are transferred between the internal circuit 140 and the LSI 11 through the MOS⇌ECL converter circuit 131. On the other hand, when the BiCMOS LSI 130 interfaces with the TTL interface LSI 10, signals are transferred between the internal circuit 140 and the LSI 10 through the TTL interface input/output circuits 141, 142. The TTL interface input and output circuits may be equivalent to the TTL interface input circuit 21 shown in FIG. 3 and the TTL interface output circuit 22 shown in FIG. 4, respectively.

According to this embodiment, it is similarly possible to construct an LSI system in which the BiCMOS LSI is simultaneously interfaceable with both the TTL interface LSI and the ECL interface LSI by the use of the smaller number of power sources, and in which the device withstand voltage of the BiCMOS LSI can be secured.

Figure 15:
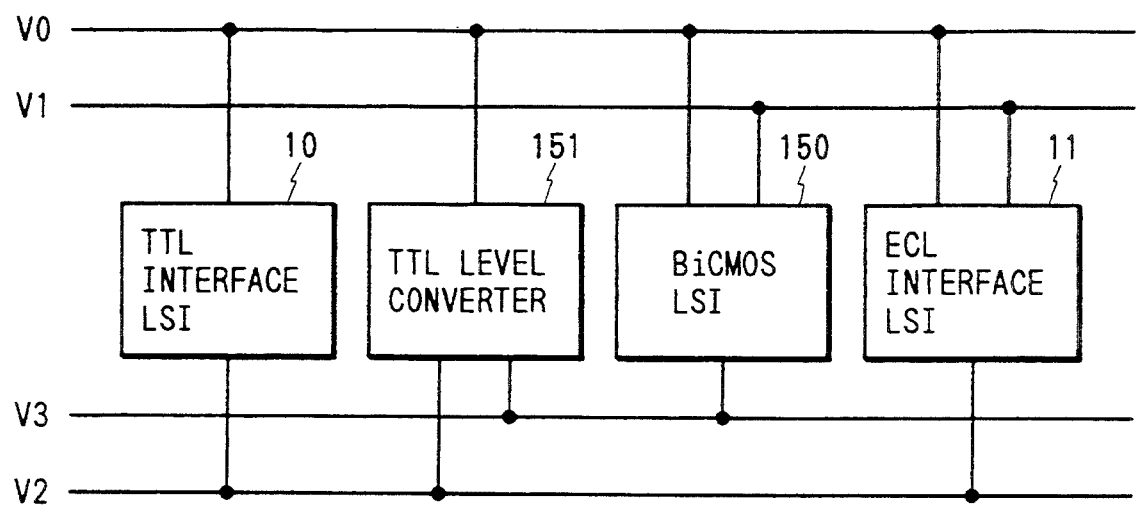
FIG. 15 is a diagram of an LSI system power source scheme showing another embodiment of the present invention.

Now, another embodiment of the present invention will be described. FIG. 15 shows a system power source scheme. While the embodiment in FIG. 7 has referred to the case where the device withstand voltage of the BiCMOS LSI 70 is about 4 V, the case of the withstand voltage of about 4 V will also be considered in the embodiment in FIG. 15. This embodiment includes a general-purpose TTL interface LSI 10, a general-purpose ECL interface LSI 11, and a BiCMOS LSI 150 and a TTL level converter circuit 151 which are especially relevant to this embodiment. Likewise to the case of FIG. 7, the TTL interface LSI 10 is fed with supply voltages V0 and V2, and the ECL interface LSI 11 is fed with a supply voltage V1 in addition to the supply voltages V0 and V2. By way of example, the potentials of the power sources V0, V2 and V1 are the ground potential, $-5.2$ V ($-5$ V or $-4.5$ V) and $-2$ V, respectively. Here, it is also the same as in the case of FIG. 7 that the power sources V0 and V2 are shared as the main power sources of the TTL interface LSI 10 and ECL interface LSI 11, and that the power source V1 is used for the emitter follower portion of the ECL circuit. The point of difference from FIG. 7 is that the TTL level converter circuit 151 is separated from the BiCMOS LSI 150.

The BiCMOS LSI 150 is fed with the supply voltages V0 and V1 for interfacing with the ECL interface LSI 11, and a supply voltage V3 for the CMOS-type internal circuit of this LSI 150. The potential of the power source V3 is, for example, $-4$ V, and the potential difference between the power source V0 (the ground potential) and the power source V3 ($-4$ V) is 4 V, with which the CMOS-type internal circuit is operated. Even if an ECL circuit exists as the internal circuit of the BiCMOS LSI 150, the above supply voltages may be fed. The TTL level converter circuit 151 is a circuit for adjusting the signal of the CMOS-type internal circuit of the BiCMOS LSI 150 to a TTL level. By way of example, this circuit 151 is equivalent to the TTL interface input circuit 81 shown in FIG. 9 or the TTL interface output circuit 82 shown in FIG. 10.

Figure 16:
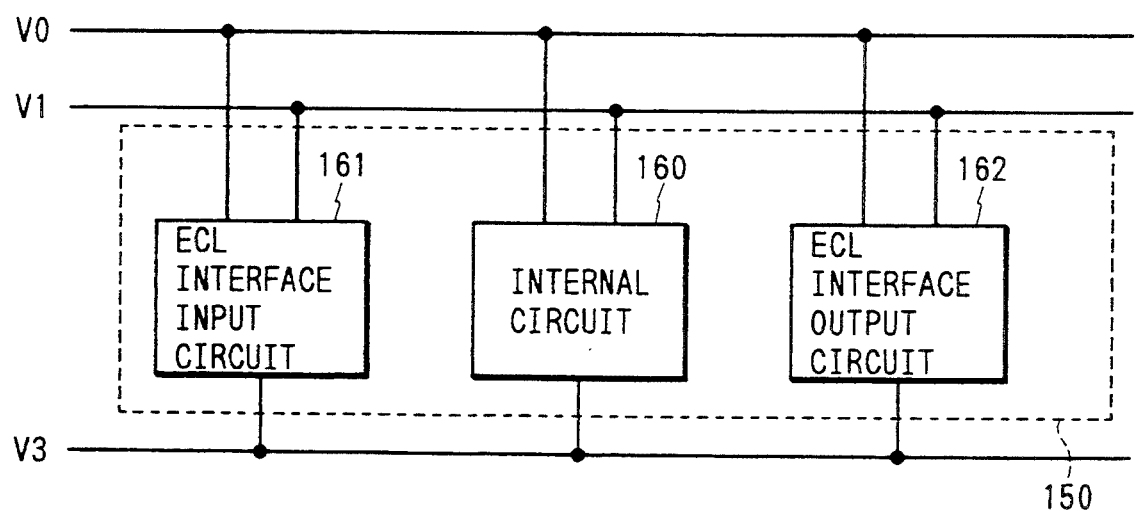
FIG. 16 is a diagram of the internal arrangement and power source scheme of a BiCMOS LSI in FIG. 15.

Next, the internal power source scheme of the BiCMOS LSI 150 will be described with reference to FIG. 16. The BiCMOS LSI 150 includes the internal circuit 160, an ECL interface input circuit 161 and an ECL interface output circuit 162. In the case where the internal circuit 160 is the CMOS-type circuit, it is fed with the supply voltages V0 and V3 and is operated with the potential difference of 4 V. If an ECL circuit is included in the internal circuit 160, the supply voltage V1 is further fed to the emitter follower portion thereof. The ECL interface input/output circuits 161, 162 are fed with the supply voltages V0, V3 and V1.

When the BiCMOS LSI 150 interfaces with the TTL interface LSI 10, signals are transferred between the internal circuit 160 and the LSI 10 through the TTL level converter circuit 151. On the other hand, when the BiCMOS LSI 150 interfaces with the ECL interface LSI 11, signals are transferred between the internal circuit 160 and the LSI 11 through the ECL interface input/output circuits 161, 162. The ECL interface input/output circuits 161, 162 can be constructed of ordinary MOS⇌ECL converter circuits.

According to this embodiment, it is similarly possible to construct an LSI system in which the BiCMOS LSI is simultaneously interfaceable with both the TTL interface LSI and the ECL interface LSI by the use of the smaller number of power sources, and in which the device withstand voltage of the BiCMOS LSI can be secured.

Figure 17:
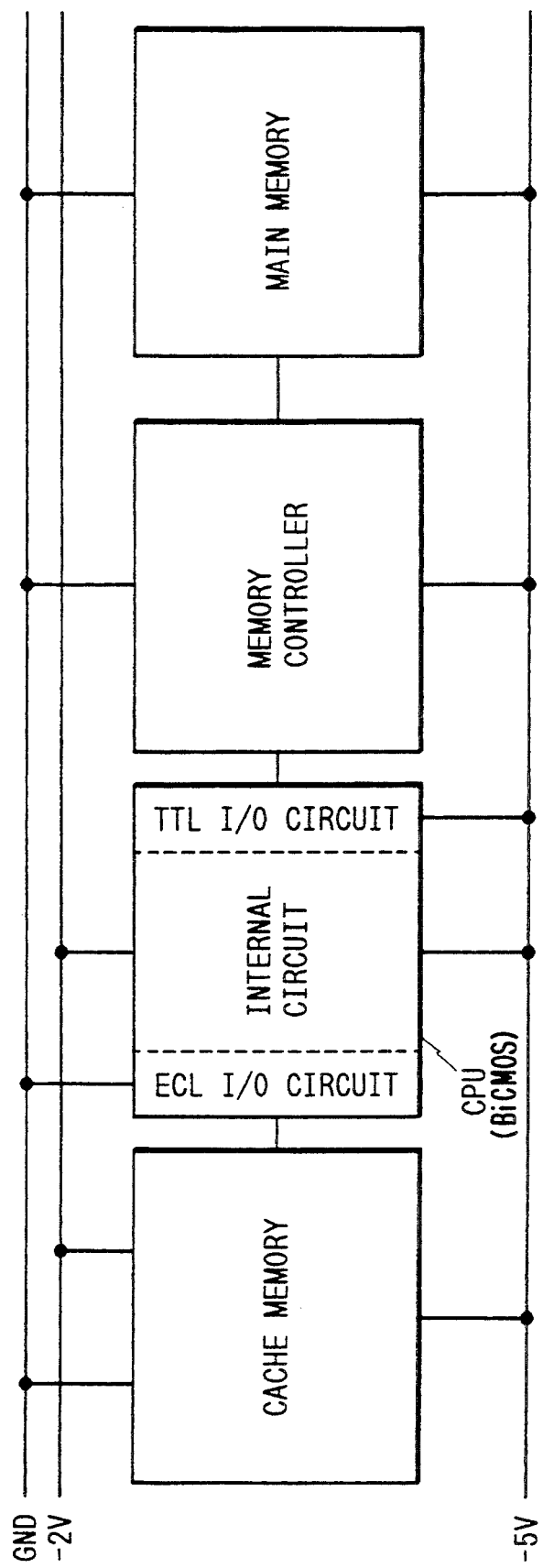
FIG. 17 is a diagram of the arrangement of a data processing system showing an example of the application of the present invention.

Shown in FIG. 17 is an embodiment in which the present invention is applied to a data processing system such as data processor. The embodiment includes a central processing unit CPU, a cache memory which is constructed of an SRAM (static random access memory) of high speed for transferring data to and from the CPU at high speed, a main memory which is constructed of a DRAM (dynamic random access memory) for storing a large amount of data to be input to or output from the CPU, and a memory controller. A GND potential line, a $-5$-V potential line and a $-2$-V potential line are connected to the cache memory having an ECL interface LSI. The GND potential line and the $-5$-V potential line are connected to the main memory having a TTL interface LSI, and a memory controller. The internal circuit of the CPU has, at least, the $-2$-V and $-5$-V potential lines connected thereto, the ECL interface input/output circuit of the CPU has, at least, the GND potential line connected thereto, and the TTL interface input/output circuit of the CPU has, at least, the $-5$-V potential line connected thereto. Such connection makes it possible to provide the data processing system in which, as described in the foregoing embodiments, the CPU configured of devices (for example, BiCMOS devices manufactured by microfabrication technology) having a device withstand voltage less than 5 V is interfaceable with the coexistent TTL and ECL interface LSI's by the use of the smaller number of supply potential lines.

By the way, the present invention is not restricted to the data processing system, but it is extensively applicable to systems each of which includes a plurality of supply potential lines.

The present invention is constructed as described above, and therefore achieves effects as stated below.

Since an LSI capable of simultaneously interfacing with a TTL interface LSI and an ECL interface LSI can be realized, a versatile LSI can be constructed. Moreover, the main power sources of the TTL and ECL interface LSI's are shared, and the minimum number of supply voltages are applied to the pertinent LSI capable of interfacing with both the interface LSI's, so as not to exceed the device withstand voltage of the pertinent LSI, whereby the number of power sources of a system can be reduced, so that the cost of the system can be curtailed. Further, since the supply voltages are applied so as not to exceed the device withstand voltage, the reliability of the pertinent LSI can be enhanced.

We claim:

1. A system comprising:

a first supply potential line which has a first potential level;

a second supply potential line which has a second potential level which is different from said first potential level;

a third supply potential line which has a third potential level which is different from said first potential level and said second potential level;

at least one ECL interface semiconductor integrated circuit, including an emitter follower, wherein the ECL interface semiconductor integrated circuit is driven by a first difference voltage between said first supply potential line and said third supply potential line, and is coupled to said second supply potential line for operating the emitter follower; and at least one semiconductor integrated circuit, coupled to the ECL interface semiconductor integrated circuit by a data signal line, which is comprised of:
  at least one internal circuit which is driven by a second difference voltage between said second supply potential level and said third supply potential level; and
  an interface portion for outputting or inputting data between the internal circuit and the ECL interface semiconductor integrated circuit via said data signal line, wherein said interface portion is driven by said first difference voltage.

2. A system in accordance with claim 1, wherein said at least one semiconductor integrated circuit is comprised of a Bi-CMOS circuit or a CMOS circuit.

3. A system in accordance with claim 1, wherein said first difference voltage is one value of about 4.5 or 5.0 or 5.2 voltage, and said second difference voltage is one value of about 2.5 or 3.0 or 3.2 voltage.

4. A system in accordance with claim 1, wherein said first difference voltage is one value of about $-4.5$ or $-5.0$ or $-5.2$ voltage, said second difference voltage is one value of about $-2.5$ or $-3.0$ or $-3.2$ voltage.

5. A system comprising:
a first supply potential line which has a first potential level;
a second supply potential line which has a second potential level which is different from said first potential level;
a third supply potential line which has a third potential level which is different from said first potential level and said second potential level;
at least one ECL interface semiconductor integrated circuit, including an emitter follower, wherein the ECL interface semiconductor integrated circuit is driven by a first difference voltage between said first supply potential line and said third supply potential line and is coupled to said second supply potential line for operating the emitter follower;
at least one TTL interface semiconductor integrated circuit which is coupled to said first and third supply potential lines to be driven by said first difference voltage; and
at least one semiconductor integrated circuit coupled to said ECL interface semiconductor integrated circuit and to said TTL interface semiconductor integrated circuit by data signal lines, wherein said semiconductor integrated circuit is comprised of:
  at least one internal circuit which is driven by a second difference voltage between said second supply potential level and said third supply potential level; and
  an interface portion for outputting or inputting data between the internal circuit and the ECL interface semiconductor integrated circuit and between the internal circuit and the TTL interface semiconductor circuit via said data signal lines, wherein said interface portion is driven by said first difference voltage.

6. A system in accordance with claim 5, wherein said at least one semiconductor integrated circuit is comprised of a Bi-CMOS circuit or a CMOS circuit.

7. A system in accordance with claim 5, wherein said first difference voltage is one value of about 4.5 or 5.0 or 5.2 voltage, and said second difference voltage is one value of about 2.5 or 3.0 or 3.2 voltage.

8. A system in accordance with claim 5, wherein said first difference voltage is one value of about $-4.5$ or $-5.0$ or $-5.2$ voltage, and said second difference voltage is one value of about $-2.5$ or $-3.0$ or $-3.2$ voltage.

9. A system comprising:
a first supply potential line which has a first potential level;
a second supply potential line which has a second potential level which is different from said first potential level;
a third supply potential line which has a third potential level which is different from said first potential level and said second potential level;
at least one ECL interface semiconductor integrated circuit, including an emitter follower, wherein the ECL interface semiconductor integrated circuit is driven by a first difference voltage between said first supply potential line and said third supply potential line and is coupled to said second supply potential line for operating the emitter follower;
at least one TTL interface semiconductor integrated circuit which is coupled to said first and third supply potential lines to be driven by said first difference voltage; and
at least one BiCMOS processor, which includes transistors having a device withstand voltage of less than 5 volts and which is coupled to said ECL interface semiconductor integrated circuit and to said TTL interface semiconductor integrated circuit by data signal lines, wherein said semiconductor integrated circuit is comprised of:
  at least one internal circuit which is driven by a second difference voltage between said second supply potential level and said third supply potential level; and
  an interface portion for outputting or inputting data between the internal circuit and the ECL interface semiconductor integrated circuit and between the internal circuit and the TTL interface semiconductor circuit via said data signal lines, wherein said interface portion is driven by said first difference voltage.

10. A data processing system in accordance with claim 9, wherein said first difference voltage is one value of about 4.5 or 5.0 or 5.2 voltage, and said second difference voltage is one value of about 2.5 or 3.0 or 3.2 voltage.

11. A data processing system in accordance with claim 9, wherein said first difference voltage is one value of about $-4.5$ or $-5.0$ or $-5.2$ voltage, and second difference voltage is one value of about $-2.5$ or $-3.0$ or $-3.2$ voltage.

12. A system comprising:
a first supply potential line which has a first potential level;
a second supply potential line which has a second potential level which is different from said first potential level;

a third supply potential line which has a third potential level which is different from said first potential level and said second potential level;

at least one ECL interface semiconductor integrated circuit, including an emitter follower, wherein the ECL interface semiconductor integrated circuit is driven by a first difference voltage between said first supply potential line and said third supply potential line, and is coupled to said second supply potential line for operating the emitter follower; and at least BiCMOS processor, which includes transistors having a device withstand voltage of less than 5 volts and which is coupled to the ECL interface semiconductor integrated circuit by a data signal line, which is comprised of:

at least one internal circuit which is driven by a second difference voltage between said second supply potential level and said third supply potential level; and an interface portion for outputting or inputting data between the internal circuit and the ECL interface semiconductor integrated circuit via said data signal line, wherein said interface portion is driven by said first difference voltage.

13. A data processing system in accordance with claim 12, wherein said first difference voltage is one value of about 4.5 or 5.0 or 5.2 voltage, and said second difference voltage is one value of about 2.5 or 3.0 or 3.2 voltage.

14. A data processing system in accordance with claim 12, wherein said first difference voltage is one value of about −4.5 or −5.0 or −5.2 voltage, and said second difference voltage is one value of about −2.5 or −3.0 or −3.2 voltage.

* * * * *